(12) United States Patent
Takasu et al.

(10) Patent No.: US 7,339,385 B2
(45) Date of Patent: Mar. 4, 2008

(54) SEMICONDUCTOR TEST APPARATUS AND INTERFACE PLATE

(75) Inventors: Hiromitsu Takasu, Tokyo (JP); Hiroyuki Mineo, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/154,285

(22) Filed: Jun. 16, 2005

(65) Prior Publication Data

US 2007/0001702 A1    Jan. 4, 2007

(30) Foreign Application Priority Data

May 30, 2005    (JP)    ............................. 2005-157117

(51) Int. Cl.
    *G01R 31/02*    (2006.01)
(52) U.S. Cl. ...................... 324/754; 324/765; 324/761
(58) Field of Classification Search .............. 324/755, 324/756, 758, 761, 765, 158.1
    See application file for complete search history.

(56) References Cited

U.S. PATENT DOCUMENTS

| | | | | |
|---|---|---|---|---|
| 4,538,878 A * | 9/1985 | Dambach et al. | ........... | 439/742 |
| 5,051,689 A * | 9/1991 | Hiwada et al. | ............. | 324/754 |
| 5,103,378 A * | 4/1992 | Stowers et al. | ............. | 361/802 |
| 5,747,994 A * | 5/1998 | Suga | ........................ | 324/158.1 |
| 5,986,458 A * | 11/1999 | Saito et al. | ................... | 324/754 |
| 5,994,894 A * | 11/1999 | Fujita | ....................... | 324/158.1 |
| 6,040,691 A * | 3/2000 | Hanners et al. | .......... | 324/158.1 |
| 6,078,187 A * | 6/2000 | Hanners et al. | ............. | 324/761 |
| 6,271,674 B1 * | 8/2001 | Hasegawa et al. | ........... | 324/754 |
| 6,316,954 B1 * | 11/2001 | Venaleck et al. | ........... | 324/761 |
| 6,348,789 B1 * | 2/2002 | Terao | ....................... | 324/158.1 |
| 6,624,646 B2 * | 9/2003 | Zaiser | ......................... | 324/754 |
| 6,707,311 B2 * | 3/2004 | Hohenwarter | ............... | 324/761 |
| 6,995,578 B2 * | 2/2006 | Shibuya et al. | ............. | 324/754 |
| 7,057,410 B1 * | 6/2006 | Wohlfarth et al. | .......... | 324/765 |
| 7,164,278 B2 * | 1/2007 | Hirschmann | ................. | 324/754 |
| 7,230,437 B2 * | 6/2007 | Eldridge et al. | ............ | 324/754 |
| 2006/0125499 A1 * | 6/2006 | Shibuya | ...................... | 324/754 |

FOREIGN PATENT DOCUMENTS

JP    2004-108898    4/2004

OTHER PUBLICATIONS

Patent Abstracts of Japan, Publication No. 2004-108898, Publication Date: Apr. 8, 2004, 2 pages.

* cited by examiner

*Primary Examiner*—Ha Tran Nguyen
*Assistant Examiner*—Arleen M. Vazquez
(74) *Attorney, Agent, or Firm*—Osha Liang LLP

(57) ABSTRACT

There is provided a semiconductor testing apparatus having a test head body having signal modules for processing the test signals, a plurality of connection cables electrically connected with the signal module and having connector pins at their ends, a plurality of types of connector housings for holding a plurality of connector pins, an interface plate having a plate body disposed on one face of the test head body and a plurality of connector blocks removably attached respectively to the plate body while storing a plural number of connector housings of either type among the plurality of types and a performance board for removably holding the electronic device and for electrically connecting the plurality of connector pins to the electronic device by being attached to the interface plate.

3 Claims, 6 Drawing Sheets

SEMICONDUCTOR TEST APPARATUS AND INTERFACE PLATE

CROSS REFERENCE

The present application claims priority from a Japanese Patent Application JP 2005-157117 filed on May 30, 2005, the contents of which are incorporated herein by reference.

FIELD OF THE INVENTION

The present invention relates to a semiconductor testing apparatus and an interface plate and more specifically to a semiconductor testing apparatus and an interface plate for testing electronic devices by inputting/outputting test signals from/to the electronic device.

BACKGROUND TECHNOLOGY

Conventionally, as a semiconductor testing apparatus for testing electronic devices such as a semiconductor integrated circuit, there has been known an apparatus in which a signal module for processing signals is housed in a test head and an interface plate for electrically connecting a performance board for removably mounting the electronic device with the module is disposed between the performance board and the test head as disclosed in Japanese Patent Laid-Open No. 2004-108898 for example.

In the semiconductor testing apparatus described above, there is a case when a plurality of types of signal modules for respectively processing test signals whose frequency or power is different from each other is used. In such a case, connector pins provided in the interface plate are preferable to have specifications suitable to the respective test signals. Accordingly, a plurality of types of connector pins is disposed in the interface plate.

However, the type of connector pin to be disposed and the method how to dispose them in the interface plate vary depending on a type of the electronic device under test. Therefore, the semiconductor testing apparatus described above requires to prepare the whole interface plate anew every time when the type of the device under test is different, thus increasing the cost. Still more, because the interface plate holds the large number of connector pins provided at ends of connection cables electrically connected with each signal module, the connector pins attached to the interface plate must be replaced one by one in the work for replacing the interface plate per every type of the electronic device, thus complicating the work.

Accordingly, it is an object of the invention to provide a semiconductor testing apparatus and an interface plate capable of solving the above-mentioned problem. This object may be achieved through the combination of features described in independent claims of the invention. Dependent claims thereof specify preferable embodiments of the invention.

SUMMARY OF INVENTION

In order to solve the above-mentioned problems, according to a first aspect of the invention, there is provided a semiconductor testing apparatus for testing electronic devices by inputting/outputting test signals from/to the electronic device, having a test head body having signal modules for processing the test signals, a plurality of connection cables electrically connected with the signal module and having connector pins at their ends, a plurality of types of connector housings for holding a plurality of connector pins, an interface plate having a plate body disposed on one face of the test head body and a plurality of connector blocks removably attached respectively to the plate body while storing a plurality of connector housings of either type among the plurality of types and a performance board for removably holding the electronic device and for electrically connecting the plurality of connector pins to the electronic device by being attached to the interface plate.

In the semiconductor testing apparatus described above, the plurality of connector blocks may be disposed in the plate body in a ring around the electronic device disposed on the performance board.

Still more, in the semiconductor testing apparatus, the plurality of connector blocks may be disposed in the plate body in a plurality of rings having different radius around the electronic device disposed on the performance board.

The interface plate may further have a ringed base that can be removably attached to the plate body and the plurality of connector blocks is attached to the base and is removably attached to the plate body in a body with the base.

According to a second aspect of the invention, there is provided an interface plate attached to a test head body of a semiconductor testing apparatus for testing electronic devices by electrically connecting the electronic device with a signal module stored in the test head body through a plurality of connection cables, having a plate body disposed on one face of the test head body and a plurality of connector blocks removably attached respectively to the plate body while storing a plural number of connector housings of either type among a plural types of connector housings for holding connector pins provided at one end of the plurality of connection cables.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
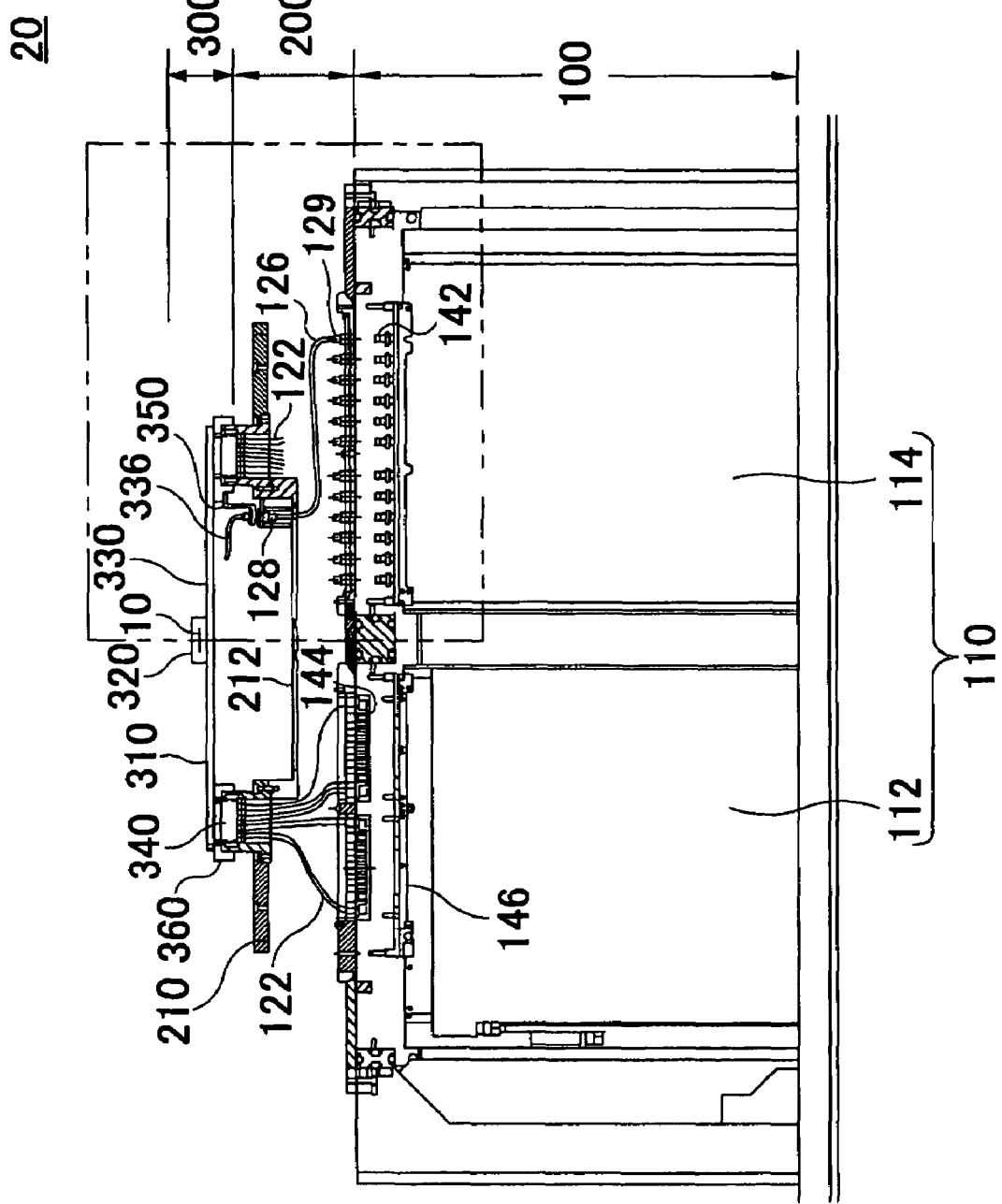
FIG. 1 is a section view showing a part of a configuration of a semiconductor testing apparatus according to an embodiment of the invention.
Figure 2:
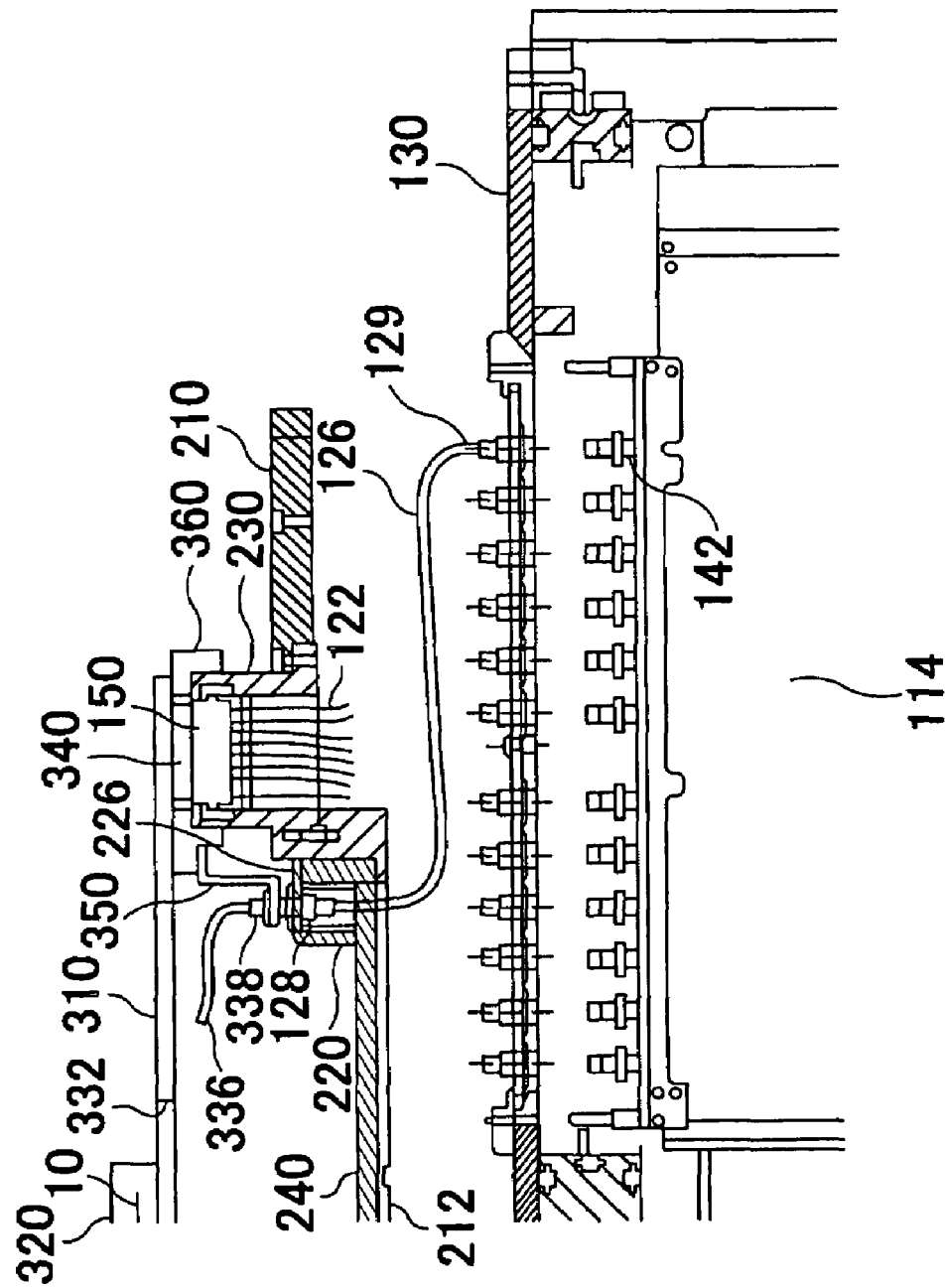
FIG. 2 is an enlarged view of a part surrounded by two-dot lines in FIG. 1.

FIG. 1 is a section view showing a part of a configuration of a semiconductor testing apparatus 20 according to an embodiment of the invention and FIG. 2 is an enlarged view of a part surrounded by two-dot lines in FIG. 1.

The semiconductor testing apparatus 20 shown in FIGS. 1 and 2 tests an electronic device 10 by inputting/outputting test signals from/to the electronic device 10. Here, the electronic device 10 is an element of a semiconductor integrated circuit to be tested and is also called as DUT (Device Under Test). The semiconductor testing apparatus 20 is also called as an automatic test equipment or ATE.

The semiconductor testing apparatus 20 has a test head body 100 for inputting/outputting the test signals, a performance board 300 for removably holding the electronic device 10 and an interface plate 200, disposed on one face of the test head body 100, for electrically connecting the test head body 100 with the performance board 300. Here, the performance board 300 is also called as a load board or a circuit board. The interface plate 200 is also called as a high fix, a test head chassis, a test fixture, a top plate and the like.

Figure 3:
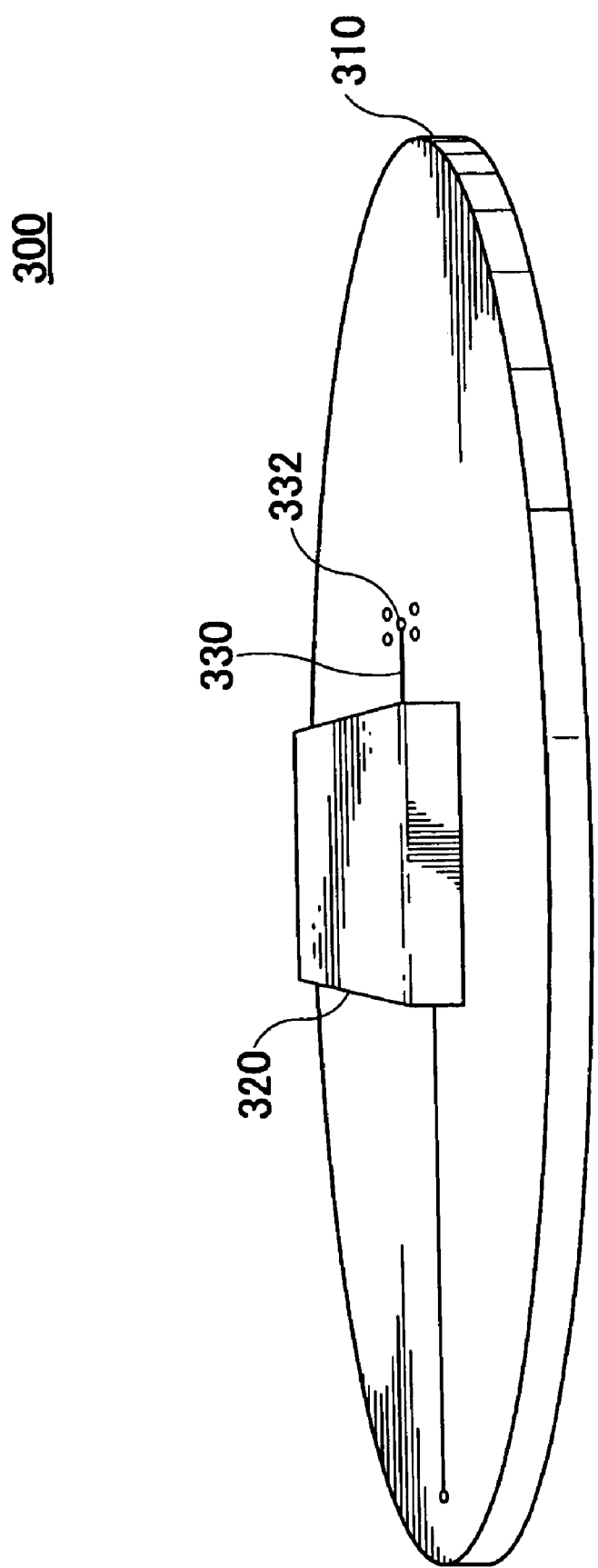
FIG. 3 is a perspective view of a plane of a performance board.
Figure 4:
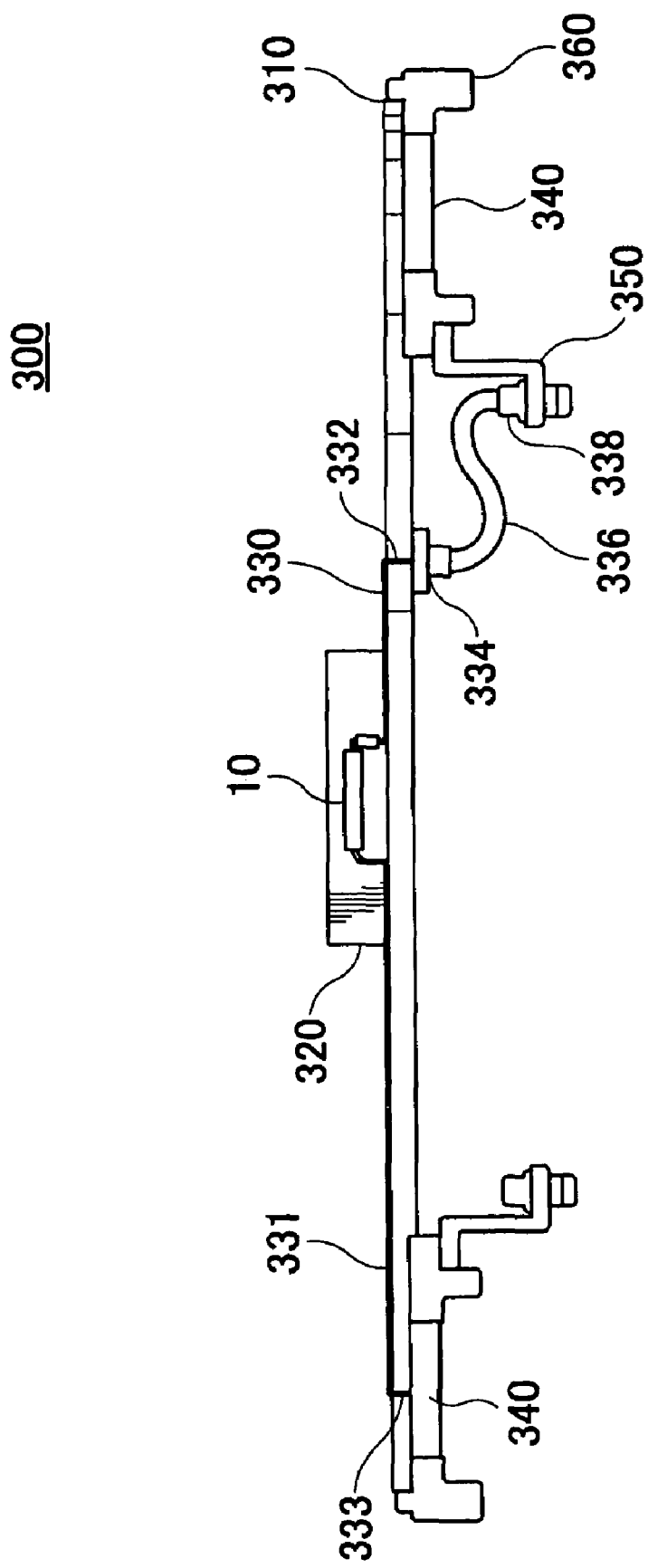
FIG. 4 is a side view of the performance board.

FIG. 3 is a perspective view of a plane of the performance board 300 and FIG. 4 is a side view of the performance board 300. As shown in FIGS. 3 and 4, the performance board 300 has a disc-like body board 310. The body board 310 may be an electric circuit board for example. The performance board 300 has a socket 320, disposed almost at the center of the body board 310, for removably holding the electronic device 10, signal lines 330 and 331 extending from the socket 320 and vias 332 and 333 electrically connected to each of the signal lines 330 and 331 and perforating through the body board 310. Those signal lines may be micro-strip lines provided on the body board 310. The signal lines 330 and 331 are provided so that their total number is greater than a total number of pins to be tested in the electronic device 10 attached to the socket 320. Although one each signal line 330 and signal line 331 are depicted in FIGS. 3 and 4 in order to simplify the drawings, actually several tens to several hundreds of signal lines 330 and 331 are provided corresponding to the number of pins of the electronic device 10. It is also noted that although only one socket 320 is provided on the performance board 300 in FIGS. 3 and 4, a plurality of sockets 320 may be provided.

Here, there is a case when test signals having different frequency or power are used for the respective pins of the electronic device 10. In particular, in addition to testing the predetermined pins of the electronic device 10 by using the conventional analog or digital test signals (A/D test signal), a high-frequency RF (Radio Frequency) test signal is often used to test the other pins of the electronic device 10 lately. Then, it is preferable to use connectors and cables suitable to the frequency or power used for the test signal for the electrical connection between the electronic device 10 and the test head body 100.

In the present embodiment, for first and second test signals which are different from each other, a first connector 340 is electrically connected to an end of the via 333 for the first test signal and a connector 334, a cable 336 and a second connector 338 are electrically connected to the end of the via 332 in this order. The first and second test signals may be the A/D test signal and the RF test signal for example.

The performance board 300 shown in FIGS. 3 and 4 has a bracket 350 extending under the body board 310. The bracket 350 supports the second connector 338 on the level below the first connector 340. The performance board 300 also has a ringed peripheral member 360 to reinforce the mechanical strength of the body board 310.

The test head body 100 shown in FIGS. 1 and 2 houses a signal module 110 including a plurality of first modules 112 for processing the first test signal and a plurality of second modules 114 for processing the second test signal. Although only two of the first module 112 and the second module 114 are depicted in FIG. 1 in order to simplify the drawing, actually they are disposed corresponding to the function and number of the pins of the electronic device 10.

The test head body 100 has a connector 146 electrically connected to the first module 112 described above and a connector 142 electrically connected to the second module 114. The test head body 100 also has a plate-like upper face 130, a connector 144 disposed on the upper face 130 to be electrically connected with the connector 146 by fitting thereto and a connector 129 to be electrically connected with the connector 142 by fitting thereto. It is noted that although those connector pairs are depicted separately in FIGS. 1 and 2 for the purpose of explanation, those connector pairs are fitted each other in the state when the semiconductor testing apparatus 20 is in use. Still more, a first cable 122 is connected to the connector 144 and a second cable 126 is connected to the connector 129. The first and second cables 122 and 126 may be a coaxial cable for example.

Figure 5:
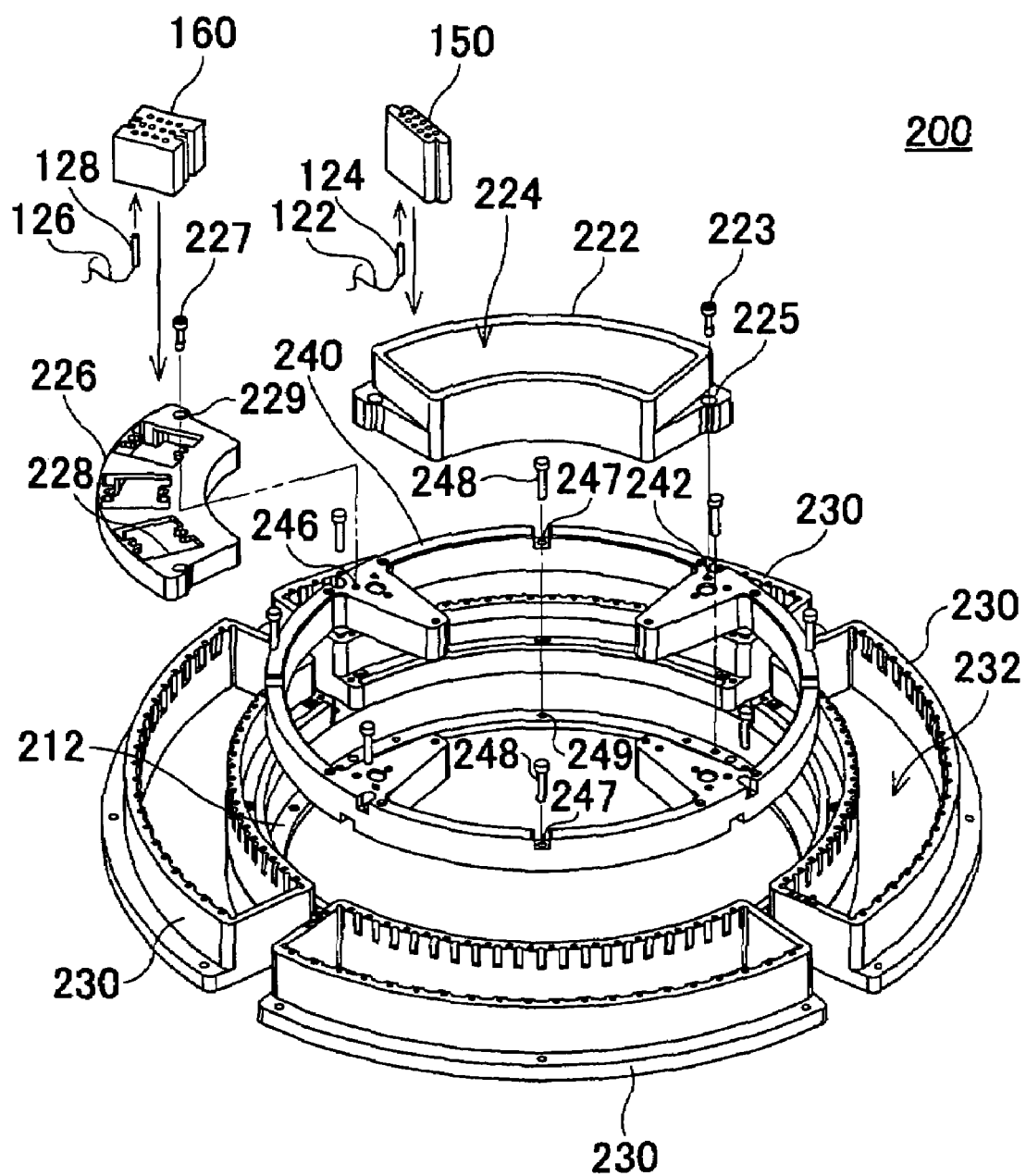
FIG. 5 is an exploded perspective view of an interface plate.
Figure 6:
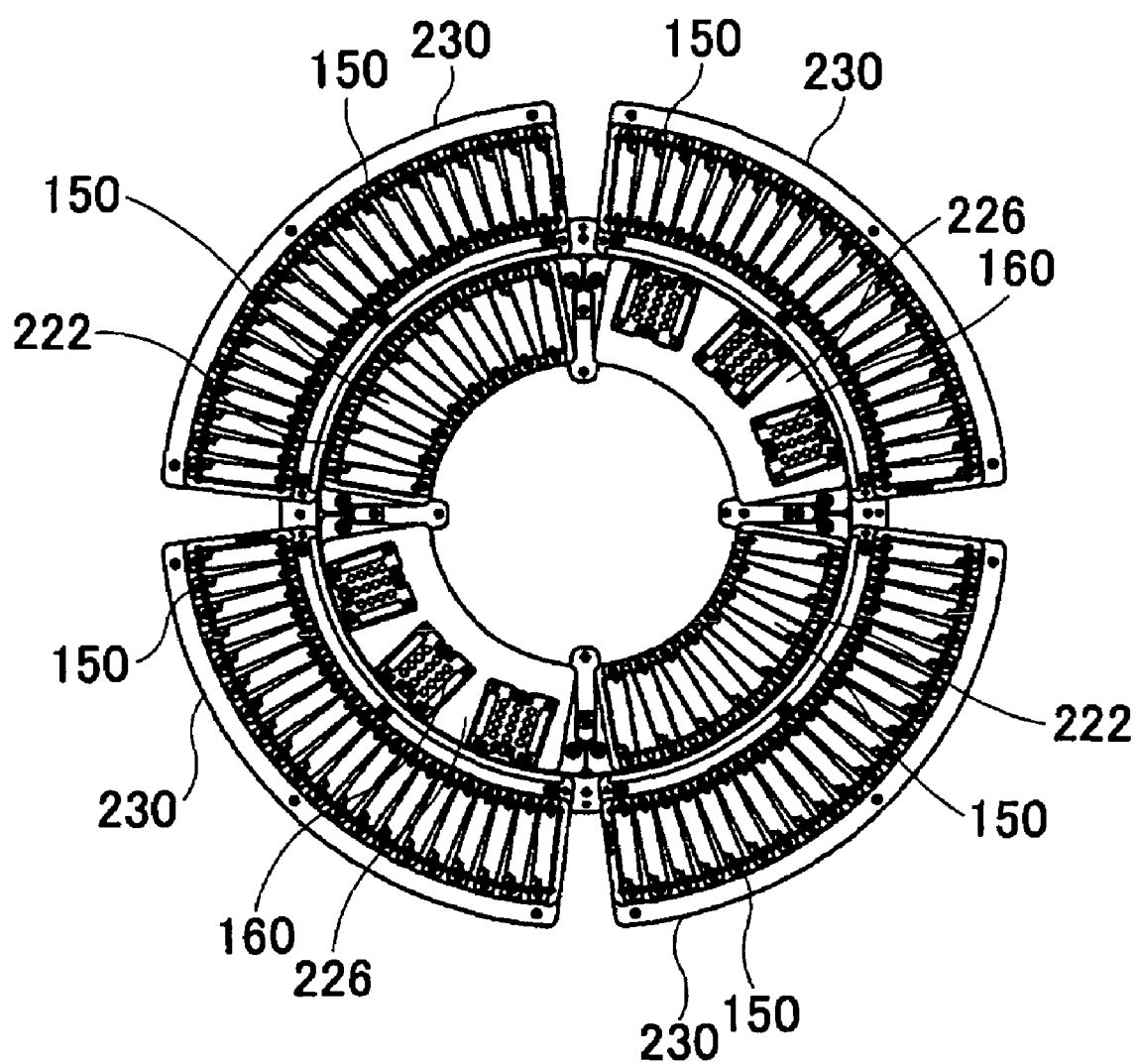
FIG. 6 is a plan view, seen from the top, of a state in which rectangular housings and square housings are held in the interface plate.

FIG. 5 is an exploded perspective view of the interface plate 200 and FIG. 6 is a plan view, seen from the top, of a state in which rectangular housings 150 and square housings 160 are held in the interface plate 200. Here, a first connector pin 124 is disposed at the end of the first cable 122 on the opposite side from the connector 144. The rectangular housing 150 has an almost rectangular shape molded by plastics and has through holes for holding the plurality of first connector pins 124, e.g., ten. The first connector pins 124 may be pressed into the through holes of the rectangular housing 150, so that the rectangular housing 150 can hold the first connector pins 124. A second connector pin 128 is disposed at the end of the second cable 126 on the opposite side from the connector 129. The square housing 160 has a columnar shape whose section has a shape approximately of a letter H and has through holes for holding the plurality of second connector pins 128, e.g., 12. The second connector pins 128 may be pressed into the through holes of the square housing 160, so that the square housing 160 can hold the second connector pins 128.

The interface plate 200 has a donut-like plate body 210 and a plurality of outer peripheral connector blocks 230 disposed in a ring centering on the position where the electronic device 10 is mounted on the performance board 300. In the mode shown in FIGS. 5 and 6, the interface plate 200 has four outer peripheral connector blocks 230 disposed in a ring. In this case, the outer peripheral connector blocks 230 are fixed to and held by the plate body 210 by screws.

The outer peripheral connector block 230 has a belt-like storage section 232 for storing the plurality of rectangular housings 150, e.g., 20, as shown in FIG. 6. In this case, the outer peripheral connector block 230 holds the rectangular housings 150 by screwing both ends of the rectangular housing 150 thereto. Thereby, the outer peripheral connector block 230 may be removably attached to the plate body 210 while storing and holding the plurality of rectangular housings 150.

The interface plate 200 also has a ringed base 240 disposed inside of the outer peripheral connector blocks 230 and inner peripheral connector blocks 220 attached to the base 240 and disposed in a ring centering on the position where the electronic device 10 is mounted on the performance board 300. In this case, the base 240 is fixed to and held by an inner peripheral bottom face 212 of the plate body 210 by screwing a screw 248 inserted into a through hole 247 of the base 240 to a screw hole 249 of the inner peripheral bottom face 212. It is noted that the base 240 is disposed at position lower than that of the outer peripheral connector block 230.

In the mode shown in FIGS. 5 and 6, the interface plate 200 has four inner peripheral connector blocks 220 disposed concentrically with the outer peripheral connector blocks 230. Here, the inner peripheral connector block 220 has a first inner peripheral block 222 and a second inner peripheral block 226 for respectively storing the rectangular housing 150 and the square housing 160 having different shape from each other as shown in FIG. 5. In the example shown in FIG. 6, a total of two of the first inner peripheral blocks 222 are disposed in the upper left and lower right parts and a total of two of the second inner peripheral blocks 226 are disposed in the upper right and lower left parts.

The first inner peripheral block 222 has a belt-like storage section 224 for storing the plurality of rectangular housings 150, e.g., eight, as shown in FIG. 6. In this case, the first inner peripheral block 222 holds the rectangular housing 150 by screwing both ends of the rectangular housing 150 thereto. Still more, the first inner peripheral block 222 is fixed to and held by the base 240 by screwing a screw 223 which is inserted into a through hole 225 to a screw hole 242 of the base 240. Thereby, the first inner peripheral block 222 may be removably attached to the base 240 while storing and holding the plurality of rectangular housings 150.

Still more, the second inner peripheral block 226 has letter-H-like storage sections 228 to store the plurality of square housings 160, e.g., three, as shown in FIGS. 5 and 6. In this case, the second inner peripheral block 226 holds the square housings 160 by screwing both ends of the rectangular housing 160 thereto. Still more, the second inner peripheral block 226 is fixed to and held by the base 240 by screwing a screw 227 inserted into a through hole 229 to a screw hole 246 of the base 240. Thereby, the second inner peripheral block 226 may be removably attached to the base 240 while storing and holding the plurality of square housings 160.

Here, the position where the first inner peripheral block 222 is disposed with respect to the base 240 is compatible with the position where the second inner peripheral block 226 is disposed. That is, the shape of the first and second inner blocks 222 and 226 is selected so that either one of the first inner peripheral block 222 or the second inner peripheral block 226 may be selectively attached to the same position of the base 240. Thereby, the degree of freedom in disposing the rectangular housing 150 and the square housing 160 may be increased.

Still more, the first inner peripheral block 222 and the second inner peripheral block 226 may be provided with pins extending downward from the lower face thereof and the base 240 may be provided with holes corresponding to the pins on the upper face thereof. Thereby, the first and second inner peripheral blocks 222 and 226 may be positioned with respect to the base 240 by inserting the pins of the first and second inner peripheral blocks 222 and 226 into the holes of the base 240. In this case, the compatibility of disposing either one of the first and second inner peripheral blocks 222 and 226 to the same position may be kept by providing sets of pins and holes common to the both of the first and second inner peripheral blocks 222 and 226.

It is noted that the plurality of rectangular housings 150 and the plurality of square housings 160 held by the first and second inner peripheral blocks 222 and 226 may be removably attached in a body to the base 240 by removably attaching the base 240 to the plate body 210 while fixing the first and second inner peripheral blocks 222 and 226 to the base 240.

In the semiconductor testing apparatus 20 constructed basically as described above, the signal module 110 is selected per every type of the electronic device 10 to be tested. Based on this selection, the disposition of the outer peripheral connector block 230, the first inner peripheral block 222 and the second inner peripheral block 226 is decided. The rectangular housings 150 holding the first connector pins 124 and the rectangular housings 160 holding the second connector pins 128 are stored in the outer peripheral connector block 230, the first inner peripheral block 222 and the second inner peripheral block 226 whose disposition is decided and are attached to the plate body 210. Corresponding to these first and second connector pins 124 and 128, a first connector 340 and a second connector 338 are attached to the body board 310 of the performance board 300. Then, the performance board 300 is disposed on the interface plate 200 while mating the pairs of connectors. Thereby, the socket 320 on the performance board 300 is electrically connected with the first and second modules 112 and 114 of the test head body 100. In this state, the electronic devices 10 may be tested by mounting them to the socket 320 one by one and by inputting/outputting the test signals from/to them.

In this case, because the outer peripheral connector blocks 230 are disposed in a ring centering on the electronic device 10, length of a signal path of the first connector pins 124 held by the plurality of rectangular housings 150 which are also held by the outer peripheral connector block 230 may be equalized almost with that of the electronic device 10. Accordingly, it becomes possible to prevent a time difference which is otherwise caused in the test signal. In the same manner, because the first and second inner peripheral blocks 222 and 226 are disposed in a ring centering on the electronic device 10, it becomes possible to prevent a time difference from occurring in the test signal for the first connector pins 124 held by the rectangular housings 150 which are also held in the first inner peripheral block 222 and the second connector pins 128 held by the square housings 160 which are also held by the second inner peripheral block 226.

As described above, according to the present embodiment, the first inner peripheral block 222 holding the plurality of rectangular housings 150 may be removably attached to the base 240 as a block and the second inner peripheral block 226 holding the plurality of square housings 160 may be also removably attached to the base 240 as a block, so that operability of user is improved in attaching the connector pins to the interface plate 200 per every type of the electronic device 10. Still more, because there is the compatibility between the positions where the first inner peripheral block 222 is attached to the base 240 and where the second inner peripheral block 226 is attached, the degree of freedom in disposing the rectangular housings and square housings 150 and 160 increases.

Still more, because the base 240 may be removably attached to the plate body 210 while attaching the first inner peripheral blocks 222 and the outer peripheral connector blocks 230 to the base 240, the plurality of rectangular housings and square housings 150 and 160 held by the both first inner peripheral blocks 222 and outer peripheral connector blocks 230 may be removably attached to the plate body 210 as a group, further improving the operability of the user.

It is noted that although the performance board 300 shown in FIGS. 3 and 4 has a disc-like shape, the shape of the performance board 300 is not limited to that. Still more, although the inner peripheral connector blocks 220 and the outer peripheral connector blocks 230 of the interface plate 200 shown in FIGS. 5 and 6 are disposed in a ring corresponding to the shape of the performance board 300, their disposition is not limited to that. For example, when the performance board 300 is rectangular, the plurality of inner peripheral connector blocks 220 and the plurality of outer peripheral connector blocks 230 may be disposed in rectangular.

Further, although the interface plate 200 shown in FIGS. 5 and 6 has the four outer peripheral connector blocks 230 disposed in a ring and the four inner peripheral connector blocks 220 disposed in a ring inside of the outer peripheral connector blocks 230, the number of the outer and inner peripheral connector blocks 220 and 230 is not limited to four. It may be more than or less than four. Still more, although the interface plate 200 is configured by the concentric double rings by the outer peripheral connector blocks 230 and the inner peripheral connector blocks 220, a connector block may be disposed further on the outside of the outer peripheral connector blocks 230 and on the inside of the inner peripheral connector blocks 220.

Although all of the outer peripheral connector blocks 230 shown in FIGS. 5 and 6 store the rectangular housings 150, the invention is not limited to that. That is, instead of some or all of the outer peripheral connector blocks 230 storing the rectangular housings 150, outer peripheral connector blocks 230 storing the square housings 160 may be disposed there.

Still more, although the outer peripheral connector blocks 230 and the first inner peripheral blocks 222 shown in FIGS. 5 and 6 store the rectangular housings 150 and the second inner peripheral blocks 226 store the square housings 160, the invention is not limited to that. For example, the plurality of types of housing may be held in one connector block by providing a storage section for storing the rectangular housings 150 and a storage section for storing the square housings 160.

Still more, either one of the pair of connectors that fit each other in the embodiment shown in FIGS. 1 through 6 may be a plug or a jack. Further, although the A/D test signal and RF test signal have been exemplified as the test signal whose frequency or power is different, the invention is not limited to them and other test signal is also applicable. In this case, the connector pin may be what corresponds to the other test signal. For example, the connector pin may be either one of a BMA (Blind-mate) connector pair or of a SMA (Sub-Miniature type A) connector pair.

As it is apparent from the above description, the invention enables one to removably attach the different types of connector housings as a block while holding them in the connector blocks.

Although the invention has been described by way of the exemplary embodiments, it should be understood that those skilled in the art might make many changes and substitutions without departing from the spirit and scope of the invention. It is obvious from the definition of the appended claims that the embodiments with such modifications also belong to the scope of the invention.

What is claimed is:

1. A semiconductor testing apparatus for testing electronic devices by inputting/outputting test signals from/to said electronic device, comprising:
    a test head body having signal modules for processing the test signals;
    a plurality of connection cables electrically connected with said signal module and having connector pins at their ends;
    a plurality of types of connector housings for holding said plurality of connector pins;
    an interface plate having a plate body disposed on one face of said test head body and a plurality of connector blocks each removably attached respectively to said plate body while each storing a plurality of connector housings of either type among said plurality of types;
    a performance board for removably holding said electronic device and for electrically connecting said plurality of connector pins to said electronic device by being attached to said interface plate; and
    wherein said plurality of connector blocks are disposed in said plate body forming a plurality of rings having different radius around said electronic device disposed on said performance board.

2. The semiconductor testing apparatus as set forth in claim 1, wherein said interface plate further comprises a ringed base that can be removably attached to said plate body; and
    said plurality of connector blocks may be removably attached to said plate body in a body with said base by attaching them to said base.

3. An interface plate attached to a test head body of a semiconductor testing apparatus for testing electronic devices by electrically connecting said electronic device with signal modules stored in said test head body through a plurality of connection cables, comprising:
    a plate body disposed on one face of said test head body;
    a plurality of connector blocks each removably attached respectively to said plate body while each storing a plural number of connector housings of either type among a plural types of connector housings for holding connector pins provided at one end of said plurality of connection cables; and
    wherein said plurality of connector blocks are disposed in said plate body forming a plurality of rings having different radius around said electronic device.

* * * * *